United States Patent [19]

Sano et al.

[11] Patent Number: 5,455,477
[45] Date of Patent: Oct. 3, 1995

[54] ENCASED PIEZOELECTRIC ACTUATOR

[75] Inventors: Mitsunori Sano; Masako Inagawa, both of Tokyo, Japan

[73] Assignee: NEC Corporation, Tokyo, Japan

[21] Appl. No.: 303,626

[22] Filed: Sep. 9, 1994

[30]  Foreign Application Priority Data

Sep. 13, 1993 [JP]  Japan .................................. 5-226289

[51] Int. Cl.⁶ .............................. H02N 2/00; H01L 41/04
[52] U.S. Cl. ........................................... 310/328; 310/340
[58] Field of Search ................................. 310/328, 340, 310/344

[56]  References Cited

U.S. PATENT DOCUMENTS

| | | | |
|---|---|---|---|
| 4,460,842 | 7/1984 | Waanders et al. | 310/328 |
| 4,958,100 | 9/1990 | Crawley et al. | 310/328 |
| 5,239,223 | 8/1993 | Miyoshi | 310/328 |
| 5,334,902 | 8/1994 | Inoi | 310/344 |
| 5,359,252 | 10/1994 | Swift et al. | 310/328 |

FOREIGN PATENT DOCUMENTS

| | | | |
|---|---|---|---|
| 3833109 | 4/1990 | Germany | 310/328 |
| 62-60482 | 3/1987 | Japan | 310/328 |

Primary Examiner—Thomas M. Dougherty
Attorney, Agent, or Firm—Burns, Doane, Swecker & Mathis

[57] ABSTRACT

A strain generating element for generating a strain in accordance with an externally provided driver voltage, a diaphragm secured to one end surface of the strain generating element and having a projecting portion, a case for encasing the strain generating element therein, a first coupler attached to the case, and a second coupler attached to the other end. A first coupler of a first piezoelectric actuator is connectable to a second coupler of a second piezoelectric actuator so that an elongation of the first actuator is transferred to the second actuator through a projecting portion of the first actuator to thereby add the elongation of the first actuator to an elongation of the second actuator in a uniform direction of elongation.

13 Claims, 11 Drawing Sheets

ENCASED PIEZOELECTRIC ACTUATOR

BACKGROUND OF THE INVENTION

1. Field of the Invention

The invention relates to an encased piezoelectric actuator having an encased strain generating element which generates strain due to the piezoelectric effect or the electrostriction effect, and more particularly to an encased piezoelectric actuator having a preloaded strain generating element.

2. Description of the Related Art

As is known in the art, a piezoelectric actuator converts an electric energy into a mechanical energy such as an elongation and a force by virtue of the piezoelectric effect. A conventional piezoelectric actuator will be explained hereinbelow with reference to FIG. 1. The following description concerns an actuator having an electrostriction effect element, however, it should be noted that the term "a piezoelectric actuator" herein is defined to include both an actuator having a piezoelectric effect element as a strain generating element and an actuator having an electrostriction effect element as a strain generating element. Accordingly, the terms "piezoelectric" and "electrostriction" may be interchanged with each other in the following disclosure.

In general, an electrostriction effect element used as a strain generating element of a piezoelectric actuator is often made of ceramics, because ceramics show the electrostriction effect. However, ceramics are brittle against mechanical impacts, and are weak against a tensile force, though ceramics are resistant to compressive forces. Accordingly, a piezoelectric actuator conventionally has been accommodated in a metal case to protect it from mechanical impacts, and further preloaded or given a compression force in advance so as to offset a tensile force acting on the piezoelectric actuator.

Another object of encasing a strain generating element is to enhance durability against the environment. That is, by hermetically sealing a case, it is possible to operate a piezoelectric actuator even in a high humidity atmosphere or a corrosive gas atmosphere to thereby greatly enhance the reliability of a piezoelectric actuator. This advantageous effect is significant to an actuator having a laminated type element and an electrostriction thin film ceramic layer to which a high magnitude of electric field is to be applied.

Another object of preloading a strain generating element is to control an elongation of an actuator utilizing a well-known phenomenon that a strain of a strain generating element to which a driver voltage is applied is dependent on a compression force acting on the element.

In an actuator illustrated in FIG. 1, an electrostriction effect element 1 operating as a strain generating element is encased and hermetically sealed in a cylindrical metal case 4 which is made of stainless steel, for instance. The electrostriction effect element 1 is of a laminated type and has a property of generating a large mechanical energy by a low drive voltage. A length of the metal case 4 is determined in accordance with a length of the element 1 to be encased in the case 4, and a length of the element 1 is determined in accordance with a required elongation.

As illustrated in FIG. 1, to the electrostriction effect element 1 is adhesively secured a diaphragm 3 and a bottom plate 19 both made of a metal. The diaphragm 3, the bottom plate 19 and the metal case 4 are hermetically welded to each other at their junctions. Lead wires 2a and 2b of the electrostriction effect element 1 are electrically connected to lead terminals 5 provided on the metal case 4.

On a peripheral edge of the diaphragm 3 is welded a cylindrical metal pipe 6. In the metal pipe 6 is placed an elongation transferring device 7 having a projection 7a extending oppositely to the element 1. The elongation transferring device 7 is formed at an outer circumferential surface thereof with a groove. An O-ring 8 is interposed between the groove and an internal surface of the metal pipe 6. The O-ring 8 guides the device 7 along the internal surface of the metal pipe 6 when the device 7 generates an elongation. If the device 7 are to be integrally formed with the diaphragm 3, it is not always necessary to provide the O-ring 8.

The above mentioned encased piezoelectric actuator is individually used. This causes problems that it is difficult to simplify parts control in manufacturing steps and decrease the number of manufacturing steps, and that an actuator is lacking in the flexibility for wide use or a wide range of elongations. Hereinbelow will be explained in detail.

As aforementioned, an elongation of an electrostriction effect element is dependent on a length of the element along a direction in which the element generates an elongation, under otherwise unchanged conditions. That is, in principle, the length of a strain generating element is without limit in accordance with various uses of a piezoelectric actuator, and accordingly the length of a metal case for encasing the element is also without limit. When an actuator is to be sold, actuators are classified in accordance with their elongations into several groups. Thus, the length of the element is much limited, however, it is still required to prepare several lengths of the elements. For instance, there has been prepared at least three length, e.g., 20 mm, 40 mm and 60 mm, for the laminated type electrostriction effect element 1 used for a conventional actuator illustrated in FIG. 1. Accordingly, it is necessary to prepare at least three lengths of the metal case 4. Thus, when a conventional actuator is intended to be used to obtain a variety of elongations, it is not possible to avoid the increase of the number of parts and the complexity of parts control.

When elements each having length of 40 mm or 60 mm are to be formed, a plurality of unit elements having a length of 20 mm are secured to each other in accordance with a desired length. However, as the number of a required length of an element is increased, element manufacturing steps are increased accordingly and also the number of necessary jigs are increased. In addition, if a manufacturing plan has to be changed, it is difficult to absorb such a change in the manufacturing steps.

SUMMARY OF THE INVENTION

It is an object of the present invention to provide a piezoelectric actuator capable of providing a wide range of elongations suitable for wide use while simplifying parts control and a stock control and decreasing the number of manufacturing steps.

In a first aspect, the invention provides an encased piezoelectric actuator including a strain generating element for generating a strain in accordance with an externally provided driver voltage, a diaphragm secured to one of end surfaces of the strain generating element perpendicular to a direction along which the strain is generated, the diaphragm having a projecting portion extending along the direction, a case for encasing the strain generating element therein, a first coupler attached to the case at the side of the one of end surfaces of the strain generating element, and a second coupler attached to the case at the side of the other end of the strain generating element. A first coupler of a first piezoelectric actuator is adapted to be connectable to a second coupler of a second piezoelectric actuator so that an elongation of the first piezoelectric actuator is transferred to the second piezoelectric actuator through a projecting portion of the first piezoelectric actuator to thereby add the elongation of the first piezoelectric actuator to an elongation of the second piezoelectric actuator into a singly directed elongation.

The first coupler can be connected to the second coupler through various coupling means as mentioned below.

The first means for coupling the first coupler to the second coupler is a threaded structure. That is, each of the first and second couplers has a cylindrical body so that one of them is able to be fit into the other, and also has a threaded portion for connecting one to the other.

In a preferred embodiment, the first coupler is formed with an externally threaded portion and the second coupler is formed with an internally threaded portion.

In another preferred embodiment, the first coupler is formed with an internally threaded portion and the second coupler is formed with an externally threaded portion.

The second means for coupling the first coupler to the second coupler is a combination of an annular projection and a groove for receiving the projection. That is, each of the first and second couplers has a cylindrical body so that one of them is able to be fit into the other, and one of the first and second couplers is formed with an annular projection along at least partially a circumferential surface thereof and the other is formed with a groove into which the annular projection is to be fit.

In a preferred embodiment, the first coupler is formed with the annular projection and the second coupler is formed with the groove.

In another preferred embodiment, the first coupler is formed with the groove and the second coupler is formed with the annular projection.

It is not necessary to form the annular projection along an entire circumferential surface of the first or second coupler. The annular projection may be formed partially along a circumferential surface of the first or second coupler. When the annular projection is to be formed partially, the groove may be formed only at a region corresponding to the partially formed projection.

In still another preferred embodiment, a plurality of the annular projections may be formed in parallel to each other. A plurality of annular projections could enhance a connection between the first and second couplers.

The annular projection preferably has a semicircular cross section.

The third means for coupling the first coupler to the second coupler is a combination of a projection and a recess for receiving the projection therein. That is, each of the first and second couplers has a cylindrical body so that one of them is able to be fit into the other, and one of the first and second couplers is formed with at least one projection on a circumferential surface thereof and the other is formed with a recess for receiving the projection.

In a preferred embodiment, the first coupler is formed with the projection and the second coupler is formed with the recess.

In another preferred embodiment, the first coupler is formed with the recess and the second coupler is formed with the groove.

A plurality of pairs of a projection and a recess may be provided and could provide a greater connection between the first and second couplers than a single pair of a projection and a recess.

A plurality of projections may be arranged in a common circumference of a circumferential surface of the first or second couplers, or may be arranged in different circumferences. In the latter arrangement, a plurality of projections may be disposed in a zigzag fashion.

The projection most preferably is hemispherical.

The fourth means for coupling the first coupler to the second coupler is a combination of holes formed with both the first and second couplers so that the holes are in alignment with each other when one of the couplers is fit into the other, and a pin which is to be inserted into the holes. Each of the first and second couplers has a cylindrical body so that one of them is able to be fit into the other. After fitting one of the couplers into the other so that the holes of the couplers are in alignment with each other, a pin is inserted through the holes to thereby couple the first coupler to the second coupler.

At least one pair of holes is necessary for coupling the couplers to each other. A plurality of pairs of holes could provide a greater connection between the first and second couplers than a single pair of holes.

The fifth means for coupling the first coupler to the second coupler is an adhesive. Each of the first and second couplers has a cylindrical body so that one of them is able to be fit into the other. Before coupling the couplers to each other, an adhesive is applied to a surface or surfaces over which the couplers are coupled to each other, of either the first or second couplers or both the first and second couplers to thereby secure the couplers to each other.

in a preferred embodiment, the piezoelectric actuator further includes a bottom plate attached to the other end surface of the strain generating element so that the bottom plate is slidable along an internal surface of the case.

In another preferred embodiment, the bottom plate is formed with a groove on a circumferential surface thereof, and an O-ring is fitted into the groove so that the bottom plate contacts with the internal surface of the case through the O-ring. The provision of the O-ring would improve the sealing between the bottom plate and the case.

In still another preferred embodiment, the bottom plate may be replaced with a diaphragm made of thin metal film in contact with the other end surface of the strain generating element and hermetically sealed with the case.

In yet another preferred embodiment, the piezoelectric actuator further includes at least one compression spring located around the projecting portion of the diaphragm and between the first coupler and the diaphragm. The compression spring or springs provide(s) a preload with the strain generating element.

The advantages obtained by the aforementioned present invention will be described hereinbelow.

In accordance with the invention, the encased piezoelectric actuator is formed with first and second couplers at opposite ends of a case. The first and second couplers have coupling means such as a threaded structure for coupling a first coupler of a first piezoelectric actuator to a second coupler of a second piezoelectric actuator. Thus, two or more actuators can be coupled to each other to thereby make it possible to add elongations of actuators into a singly directed elongation. Accordingly, a wide variety of elongations can be obtained without preparing a large number of elements and cases. Thus, it is possible to obtain a wide range of elongations suitable for wide use without failing to simplify parts control and a stock control and decrease the number of manufacturing steps.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 2:
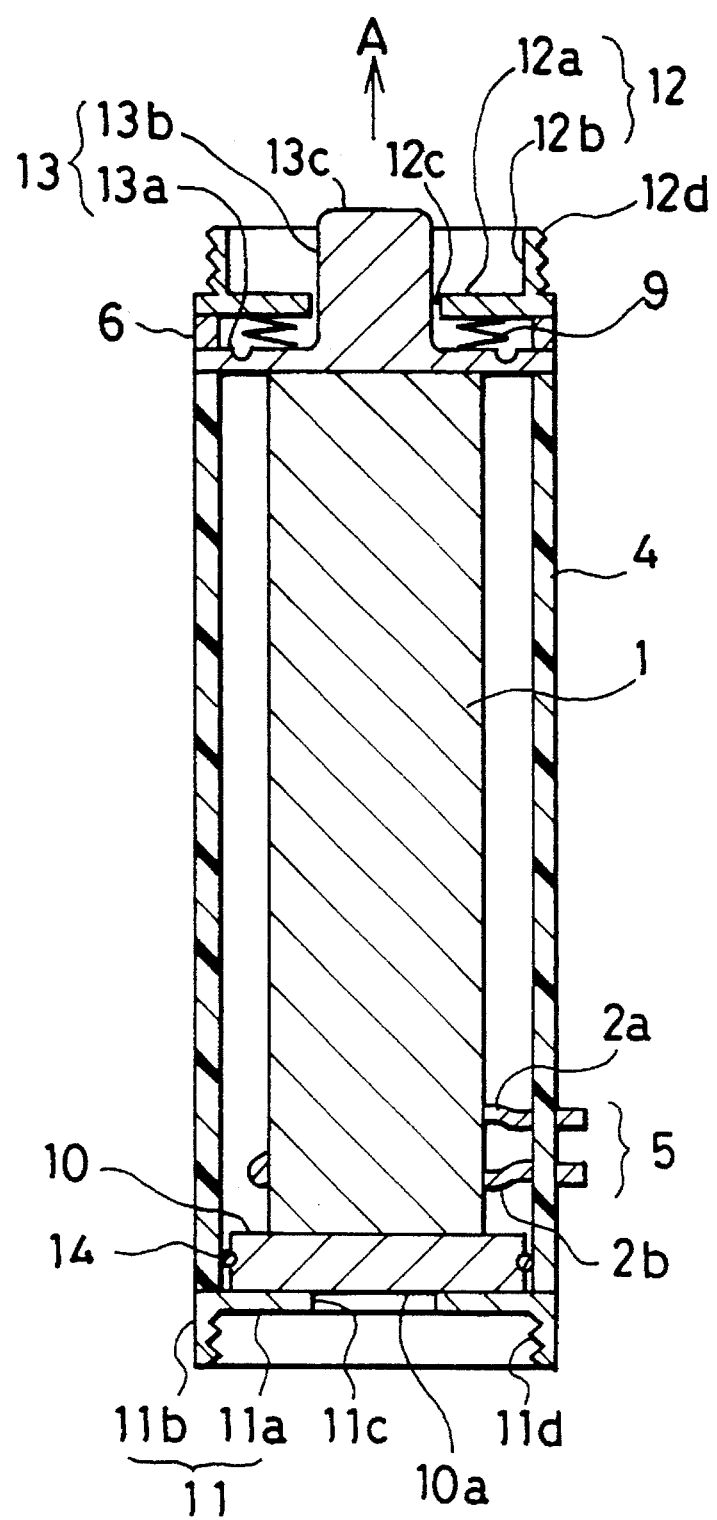
FIG. 2 is a cross-sectional view of a first embodiment in accordance with the invention.

FIG. 2 illustrates a first embodiment of a piezoelectric actuator in accordance with the invention. The piezoelectric actuator in accordance with the first embodiment is manufactured as follows.

First, an electrostriction effect element 1 which generates a strain in accordance with an externally provided driver voltage is inserted a cylindrical metal case 4 made of stainless steel. Then, lead wires 2a and 2b of the electrostriction effect element 1 is electrically connected through a solder to lead terminals 5 of the case 4.

Then, an actuator is assembled so that the element 1 is surrounded by a diaphragm 13, the metal case 4 and a circular bottom plate 10 made of stainless steel, and subsequently is dried by heating under vacuum in a container for heat-drying under vacuum.

The diaphragm 13 is made of stainless steel and has a circular plate 13a and a projecting portion 13b located at the middle of the circular plate 13a and extending in a direction opposite to the electrostriction effect element 1. The circular plate 13a serves as a thin film diaphragm and the projecting portion 13b serves as an elongation transferring member. The circular bottom plate 10 is formed at a circumferential surface thereof with a groove. An O-ring 14 is fitted into the groove, and hence the bottom plate 10 is slidable on an internal surface of the case 4 through the O-ring 14.

Then, an air present inside the assembly is replaced with nitrogen gas to thereby form a nitrogen gas atmosphere in the assembly, and subsequently the diaphragm 13 is welded to the metal case 4 by means of a carbon dioxide laser.

Then, a cylindrical metal pipe 6 made of stainless steel is welded on the circular plate 13a of the diaphragm 13.

To a bottom surface of the metal case 4 is laser-welded a lower coupler 11 made of stainless steel. The lower coupler 11 has a circular plate 11a and a cylindrical hollow pipe 11b integrally formed with the plate 11a and extending from a periphery edge of the circular plate 11a. The circular plate 11a is formed at a center thereof with an opening 11c having a diameter sufficient to pass the projecting portion 13b of the diaphragm 13 therethrough. The cylindrical hollow pipe 11b is formed at an internal surface thereof with an internally threaded portion 11d.

Above the metal pipe 6 is laser-welded an upper coupler 12 made of stainless steel. The upper coupler 12 has a circular plate 12a and a cylindrical hollow pipe 12b integrally formed with and extending form the plate 12a. The circular plate 12a is formed at a center thereof with an opening 12c having a diameter sufficient to pass the projecting portion 13b of the diaphragm 13 therethrough. The cylindrical pipe 12b is formed at an external surface thereof with an externally threaded portion 12d which is to mate to the internally threaded portion 11d of the lower coupler 11.

Around the projecting portion 13b of the diaphragm 13 are disposed three belleville springs 9 in series for preloading the electrostriction effect element 1. The belleville springs 9 are interposed and hence compressed between the circular plate 12a of the upper coupler 12 and the diaphragm 13 to thereby provide a compression force to the electrostriction effect element 1.

In the first embodiment, the electrostriction effect element 1 has three dimensions of a length of 5 mm, a width of 5 mm and a height of 20 mm, and generates an elongation of 16 micrometers in a direction indicated by an arrow A when 150 DCV is applied thereto through the lead terminals 5.

Figure 3:
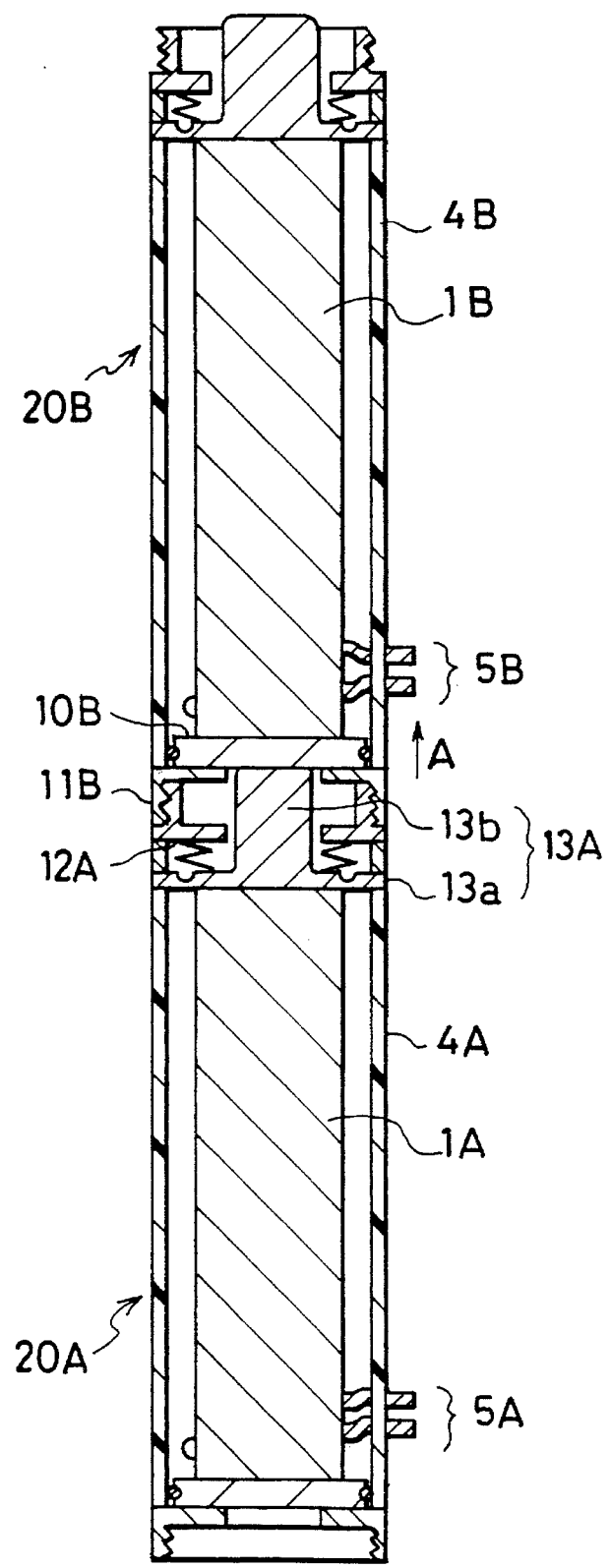
FIG. 3 is a cross-sectional view of the two piezoelectric actuators coupled to each other, each piezoelectric actuator being illustrated in FIG. 2.

The actuators may be connected in series to each other, as illustrated in FIG. 3, by threadably engaging the upper coupler of an actuator to the lower coupler of another actuator, to thereby make it possible to add elongations of these actuators to each other. When an upper coupler of an actuator is coupled to a lower coupler of another actuator, a top surface 13c of the projecting portion 13b of the diaphragm 13 of the actuator is adapted to be in contact with a lower surface 10a of the bottom plate 10 of the another actuator.

With reference to FIG. 3, when 150 DCV is applied to a lower actuator 20A through lead terminals 5A thereof, an electrostriction effect element 1A is elongated to thereby push up a diaphragm 13A in a direction indicated by an arrow A. A projecting portion 13b of a diaphragm 13A pushes up an electrostriction effect element 1B coupled to the element 1A and encased in a meal case 4B by 16 micrometers through a bottom plate 10B.

Then, when 150 DCV is applied to the upper actuator 20B through lead terminals 5B thereof, the electrostriction effect element 1B is elongated by 16 micrometers. Accordingly, the coupled actuators 20A and 20B totally provide an elongation of 32 micrometers. Thus, a doubled elongation can be obtained by coupling the two actuators with each other.

In the first embodiment, two actuators are coupled as an example, however, it should be noted that three or more actuators may be coupled in series. Since the actuator in accordance with the first embodiment is provided with threaded portions for coupling actuators in both the upper and lower couplers, the desired number of actuators may be coupled to one another to thereby enable to obtain a desired elongation, as can be easily understood to those skilled in the art from the arrangement illustrated in FIG. 3. More specifically, assuming that a piezoelectric actuator provides an elongation D, N actuators coupled in series to one another provide an elongation ND.

In addition, it is possible to drive each of coupled actuators with a common driver voltage or different driver voltages.

Figure 1:
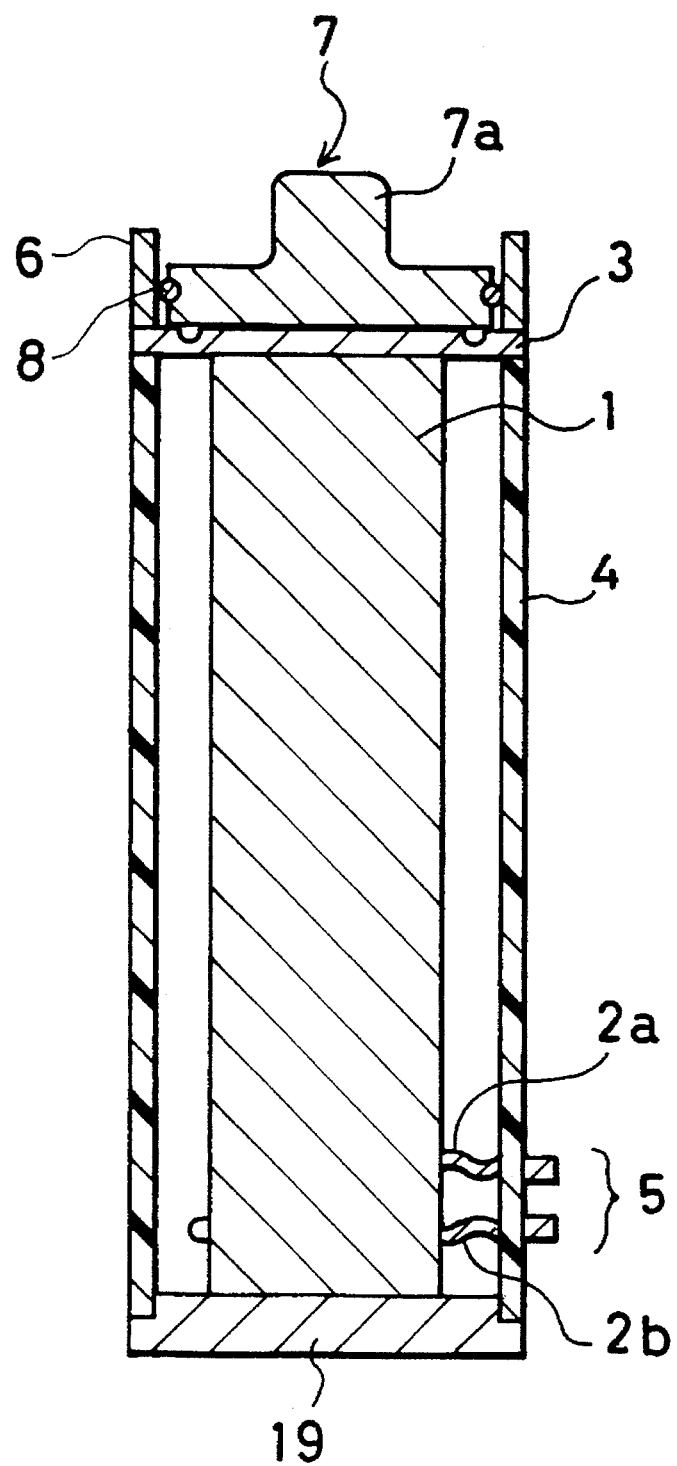
FIG. 1 is a cross-sectional view of a conventional encased piezoelectric actuator.

In the first embodiment, the diaphragm 13 has the column-shaped projecting portion 13b integrally formed with the circular plate 13a. However, the circular plate 13a serving as a diaphragm and the projecting portion 13b serving as an elongation transferring device may be separately manufactured similarly to a conventional actuator as illustrated in FIG. 1.

Similarly, the metal pipe 6 may be integrally formed with the upper coupler 12, though they are separately manufactured in the first embodiment. The metal case may have a thickness thicker that of the diaphragm for enhancing the stiffness of the metal case, thereby it is possible to avoid a deformation of the metal case which might occur during connecting actuators with each other. For instance, the metal case may have a thickness of 0.5 mm which is thicker than the thickness of the diaphragm which is usually in the range of 0.1 to 0.3 mm.

Figure 4:
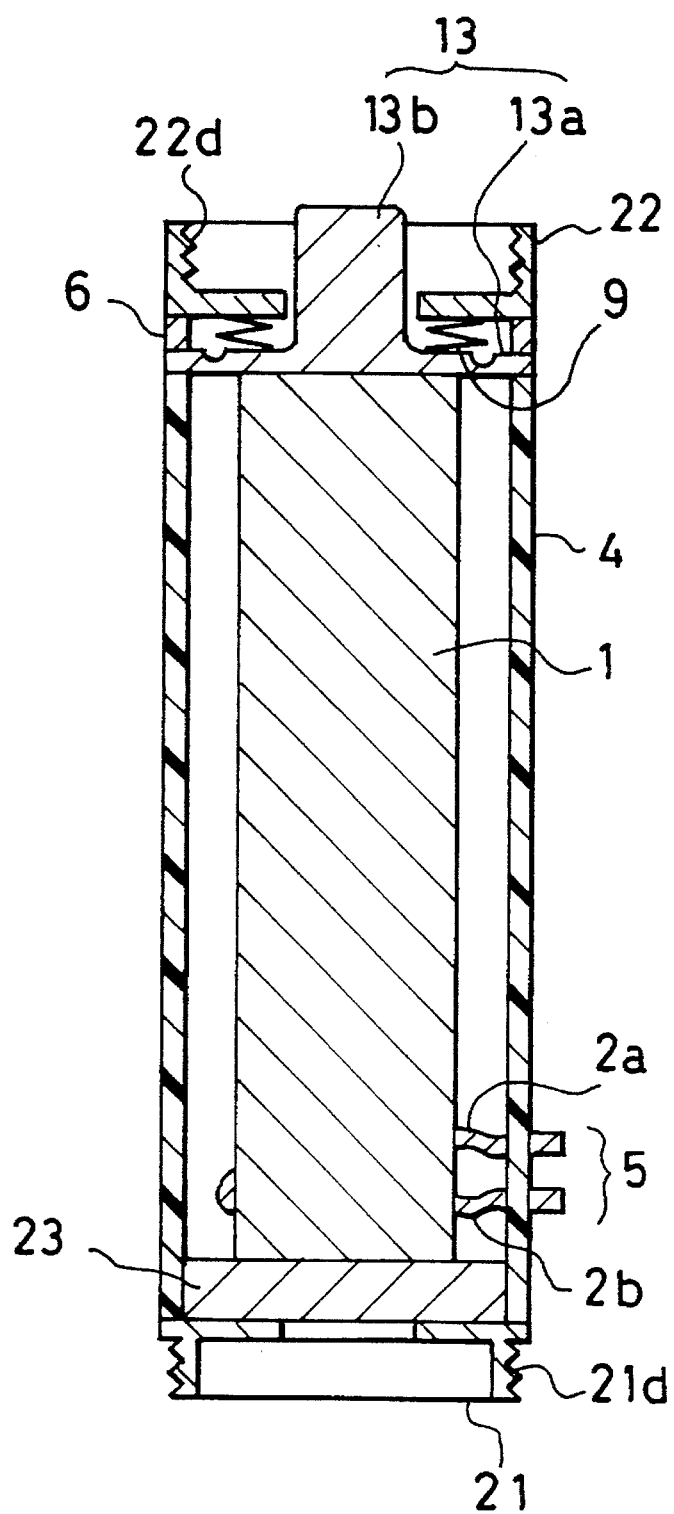
FIG. 4 is a cross-sectional view of a second embodiment in accordance with the invention.

FIG. 4 illustrates a second embodiment of a piezoelectric actuator in accordance with the invention. In the second embodiment, a lower coupler 21 is formed at an external surface thereof with an externally threaded portion 21d, and an upper coupler 22 is formed at an internal surface thereof with an internally threaded portion 22d. Those skilled in the art would easily understand that the second embodiment operates in the same fashion as the first embodiment.

It should be noted that a bottom plate 23 in the second embodiment is not provided with the O-ring 14 provided in the first embodiment, and that the bottom plate 23 is slidable directly along an internal surface of the metal case 4. The bottom plate 23 is not hermetically welded to the metal case 4, but slidable along the internal surface of the case 4 unlike the conventional actuator illustrated in FIG. 1. Accordingly, the second embodiment is slightly inferior to the conventional actuator with respect to the airtightness. Recently, an actuator has been widely used due to the characteristic that an actuator can quite precisely control a minute elongation in the micrometer order. For instance, an actuator is presently used for controlling a position of an X-Y stage of an exposure device used in manufacturing LSI, or for controlling an optical path of optical devices. The atmosphere in which these devices are to be used is a good atmosphere with the temperature and humidity being maintained constant, and hence there is no necessity of paying attention to the atmosphere resistance of an actuator. The actuator in accordance with the second embodiment provides great advantages as above mentioned when used for the aforementioned devices.

Figure 5:
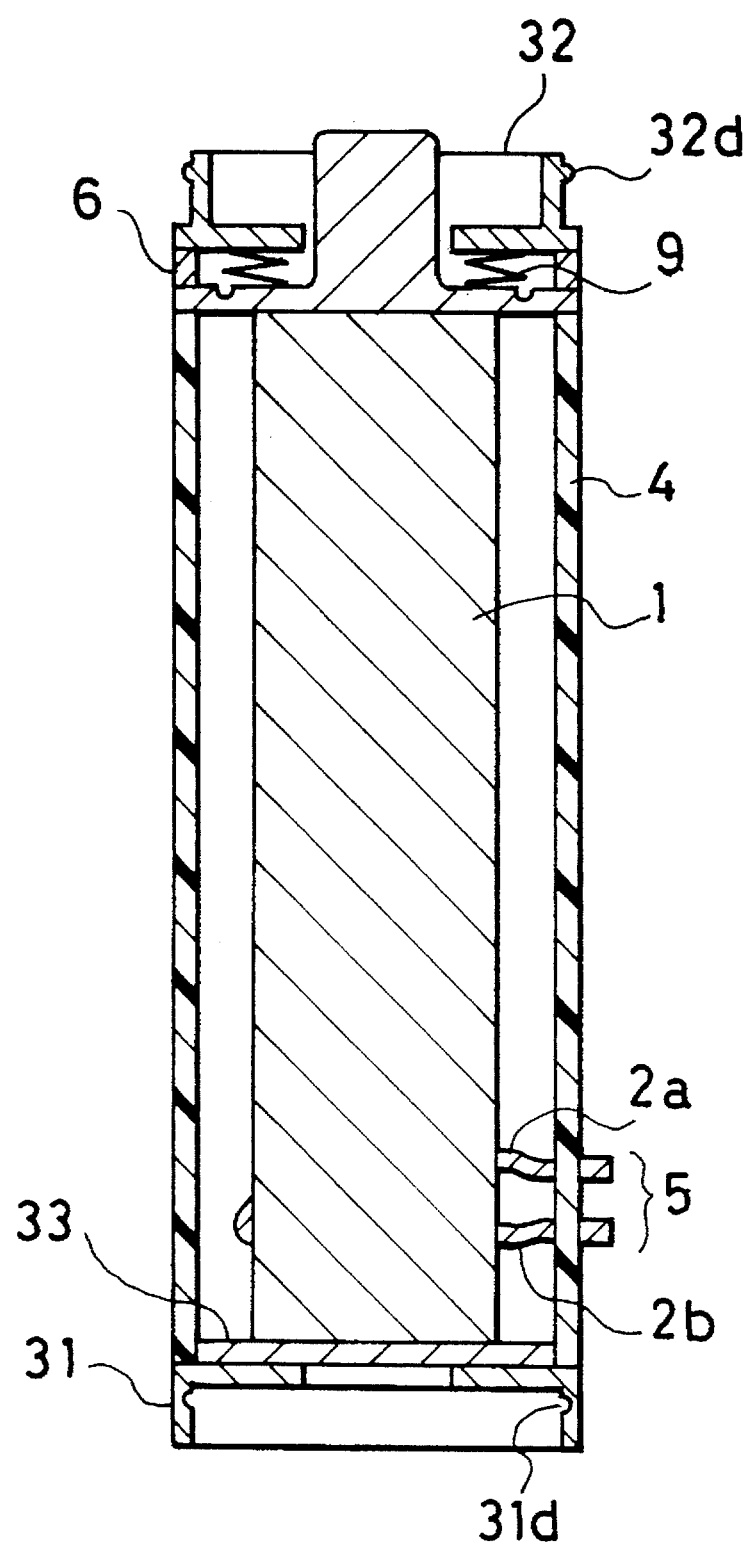
FIG. 5 is a cross-sectional view of a third embodiment in accordance with the invention.

FIG. 5 illustrates a third embodiment of a piezoelectric actuator in accordance with the invention. The piezoelectric actuator in accordance with the third embodiment has the same structure as the first embodiment illustrated in FIG. 1 except two differences.

Figure 6:
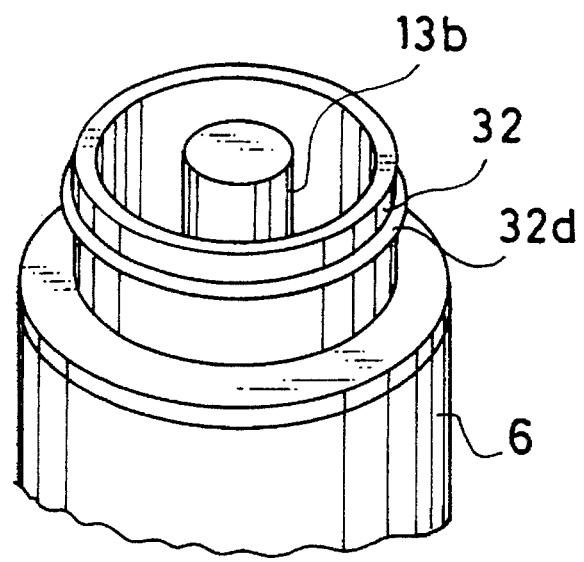
FIG. 6 is an enlarged perspective view illustrating an upper coupler of the piezoelectric actuator in accordance with the third embodiment.

The first difference is that an upper coupler 32 in the third embodiment is formed at an external surface thereof with an annular or ring-shaped projection 32d having a semicircular cross-section, as illustrated in FIG. 6, in place of the externally threaded portion 12d in the first embodiment, and a lower coupler 31 in the third embodiment is formed at an internal surface thereof with a groove 31d for receiving the annular projection 32d in place of the internally threaded portion 11d in the first embodiment. By fitting the annular projection 32d of the upper coupler 32 of a piezoelectric actuator into the groove 31d of the lower coupler 31 of another piezoelectric actuator, it is possible to couple N actuators to one another similarly to the arrangement illustrated in FIG. 3, to thereby obtain N times elongations.

The annular projection 32d may be formed entirely (FIG. 6) or partially on an external surface of the upper coupler 32. When the annular projection 32d is formed partially on an external surface of the upper coupler 32, the circumferential groove 31d may be formed so that the groove 31d has the same length as that of the partially formed annular projection 32d.

A plurality of annular projections 32d may be formed in parallel to one another on an external surface of the upper coupler 32. A plurality sets of projections and grooves cause a stronger coupling between upper and lower couplers.

In the third embodiment, the circumferential groove 31d and the ring-shaped projection 32d has a semicircular cross-section. However, it should be noted that the groove 31d and the projection 32d may have another shaped cross-section suitable for coupling a lower coupler with an upper coupler. For instance, the annular projection 32d and the groove 31d may have a triangular cross-section.

The second difference is that a diaphragm 33 made of thin metal film is secured in place of the bottom plate 10 to an internal surface of the metal case 4 at a lower end of the electrostriction effect element 1. This replacement easily enhances the airtightness of the actuator to thereby maintain the airtightness to the same degree as that of a conventional actuator.

Figure 7:
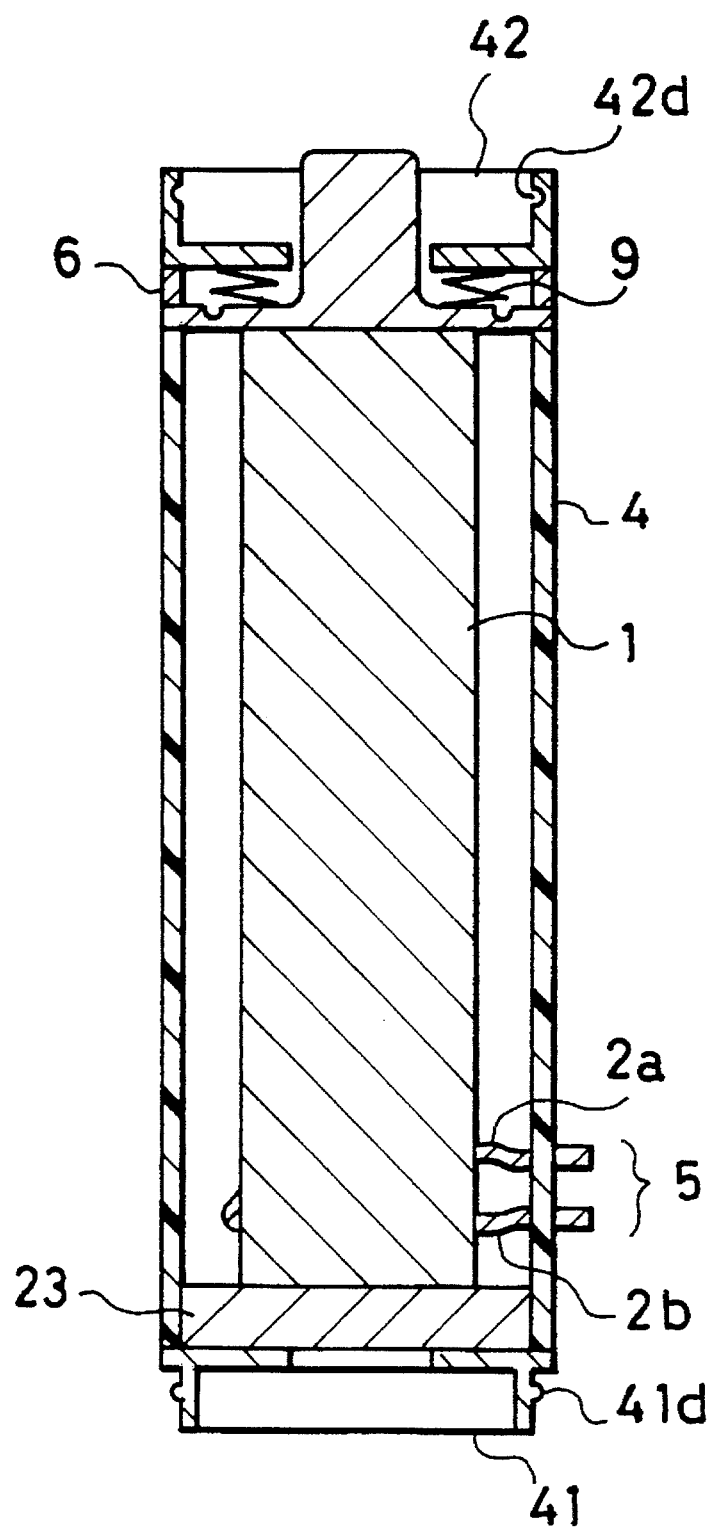
FIG. 7 is a cross-sectional view of a fourth embodiment in accordance with the invention.

FIG. 7 illustrates a fourth embodiment of a piezoelectric actuator in accordance with the invention. In the fourth embodiment, a lower coupler 41 is formed at an external surface thereof with an annular projection 41d and an upper coupler 42 is formed at an internal surface thereof with a groove 42d in contrast to the third embodiment. Those skilled in the art would easily understand that the fourth embodiment can operate in the same manner as the third embodiment.

Figure 8:
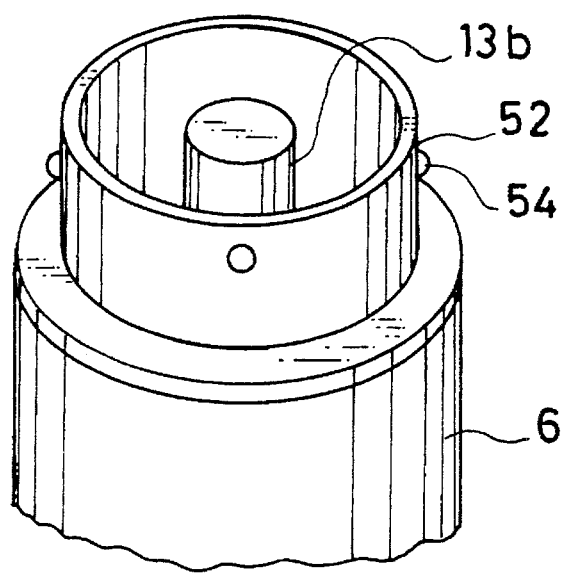
FIG. 8 is a cross-sectional view of a fifth embodiment in accordance with the invention.

FIG. 8 illustrates a fifth embodiment of a piezoelectric actuator in accordance with the invention. In the fifth embodiment, an upper coupler 52 is formed at an external surface thereof with a plurality of hemispherical projections 54 in place of the annular projection 32d in the third embodiment, and a lower coupler is formed at an internal surface thereof with recesses for receiving the hemispherical projections 54 therein in place of the groove 31d in the third embodiment. By fitting the hemispherical projections 54 of the upper coupler 52 of an actuator to the recesses of the lower coupler of another coupler, a plurality of piezoelectric actuators can be connected in series to thereby make it possible to obtain combined elongations of the actuators similarly to the first to fourth embodiments.

The plurality of hemispherical projections 54 may be equally spaced on an external surface of the upper coupler 52, or may be randomly disposed. In addition, the plurality of hemispherical projections 54 may be disposed in a common circumference as illustrated in FIG. 8, or may be disposed in different circumferences.

It is obvious for those skilled in the art that the upper coupler may be formed with recesses and the lower coupler may be formed with projections.

Figure 9:
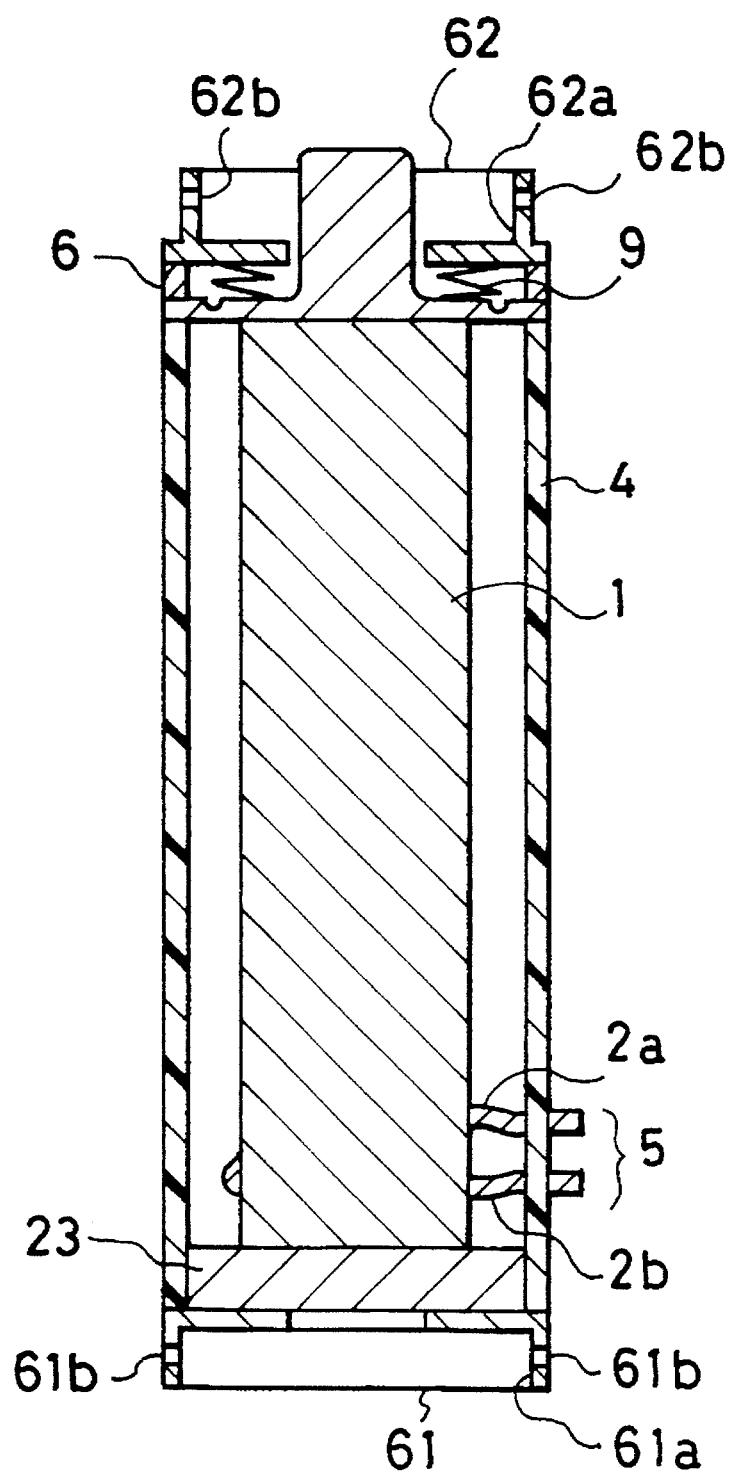
FIG. 9 is a cross-sectional view of a sixth embodiment in accordance with the invention.

FIG. 9 illustrates a sixth embodiment of a piezoelectric actuator in accordance with the invention. In the sixth embodiment, each of a lower coupler 61 and an upper coupler 62 comprises a cylindrical body 61a and 62a so that the cylindrical body 61a of the lower coupler of a piezoelectric actuator can be fit into the cylindrical body 62a of the upper coupler 62 of another piezoelectric actuator. Each of the cylindrical bodies 61a and 62a is formed with two small diameter holes 61b and 62b at opposite ends of a certain diameter thereof. The two holes 61b and 62b are disposed so that they are in alignment with each other when the cylindrical body 61a of the lower coupler of a piezoelectric actuator has been fit into the cylindrical body 62a of the upper coupler 62 of another piezoelectric actuator.

Figure 10:
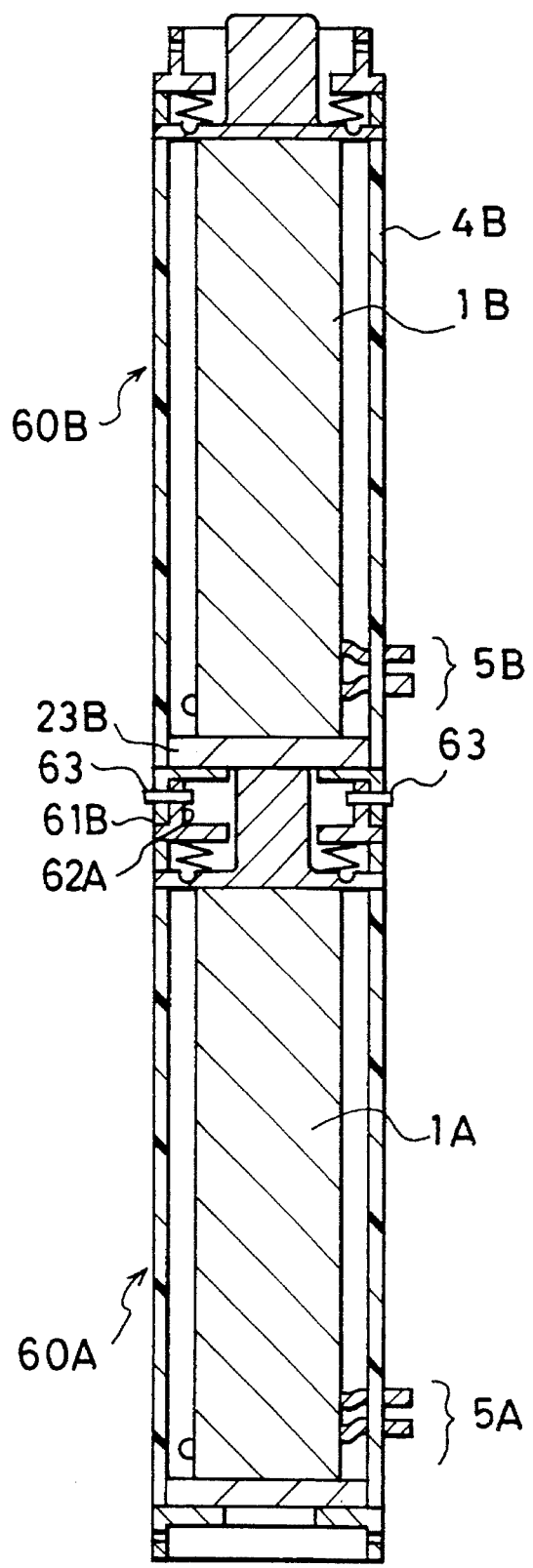
FIG. 10 is a cross-sectional view of the two piezoelectric actuators coupled to each other, each piezoelectric actuator being illustrated in FIG. 9.

FIG. 10 illustrates the piezoelectric actuators in accordance with the sixth embodiment, coupled to each other. First, a cylindrical body of a lower coupler 61B of a piezoelectric actuator 60B is fit into a cylindrical body of an upper coupler 62A of another piezoelectric actuator 60A, and then two holes of these two actuators 60A and 60B are aligned with each other. Secondly, pins 63 having approximately the same diameter as that of the hole are inserted through the aligned two holes. Thus, the two actuators 60A and 60B are coupled to each other and thereby it is possible to combine an elongation of the electrostriction effect element 1A with an elongation of the element 1B similarly to the first to fifth embodiments.

In the sixth embodiment, each of the cylindrical bodies 61a and 62a is formed with the two holes 61b and 62b, however, it should be noted that the number of holes is not limited to two (2). Three or more holes may be provided. In addition, a plurality of holes may be formed on internal and external surfaces of the couplers in a heightwise direction thereof.

Figure 11:
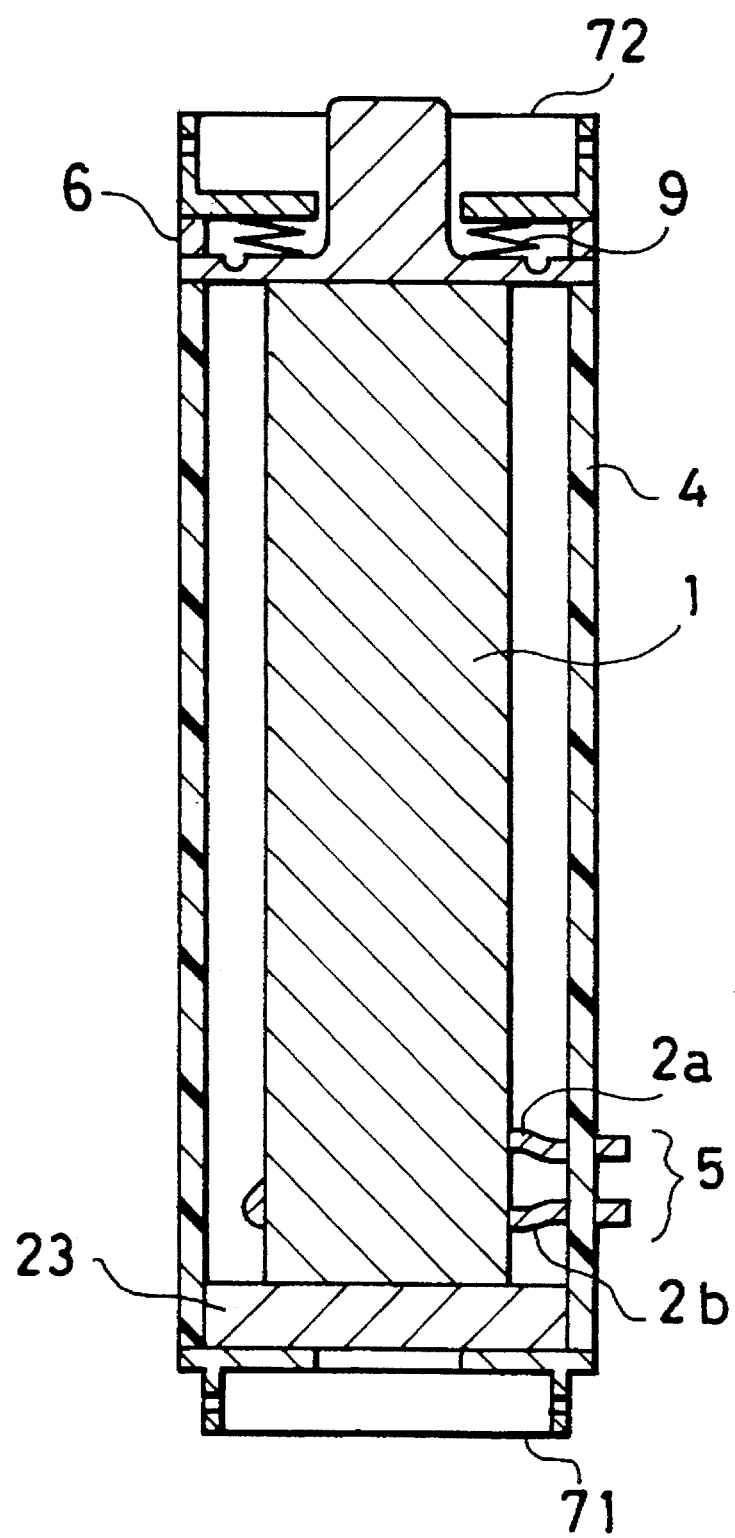
FIG. 11 is a cross-sectional view of a variation of the sixth embodiment.

FIG. 11 illustrates a variation of the sixth embodiment. In the sixth embodiment illustrated in FIG. 9, the lower coupler 61 comprises an external cylindrical body and the upper coupler comprises an internal cylindrical body, however, as illustrated in FIG. 11, a lower coupler 71 may comprise an internal cylindrical body and an upper coupler 77 may comprise an external cylindrical body.

Figure 12:
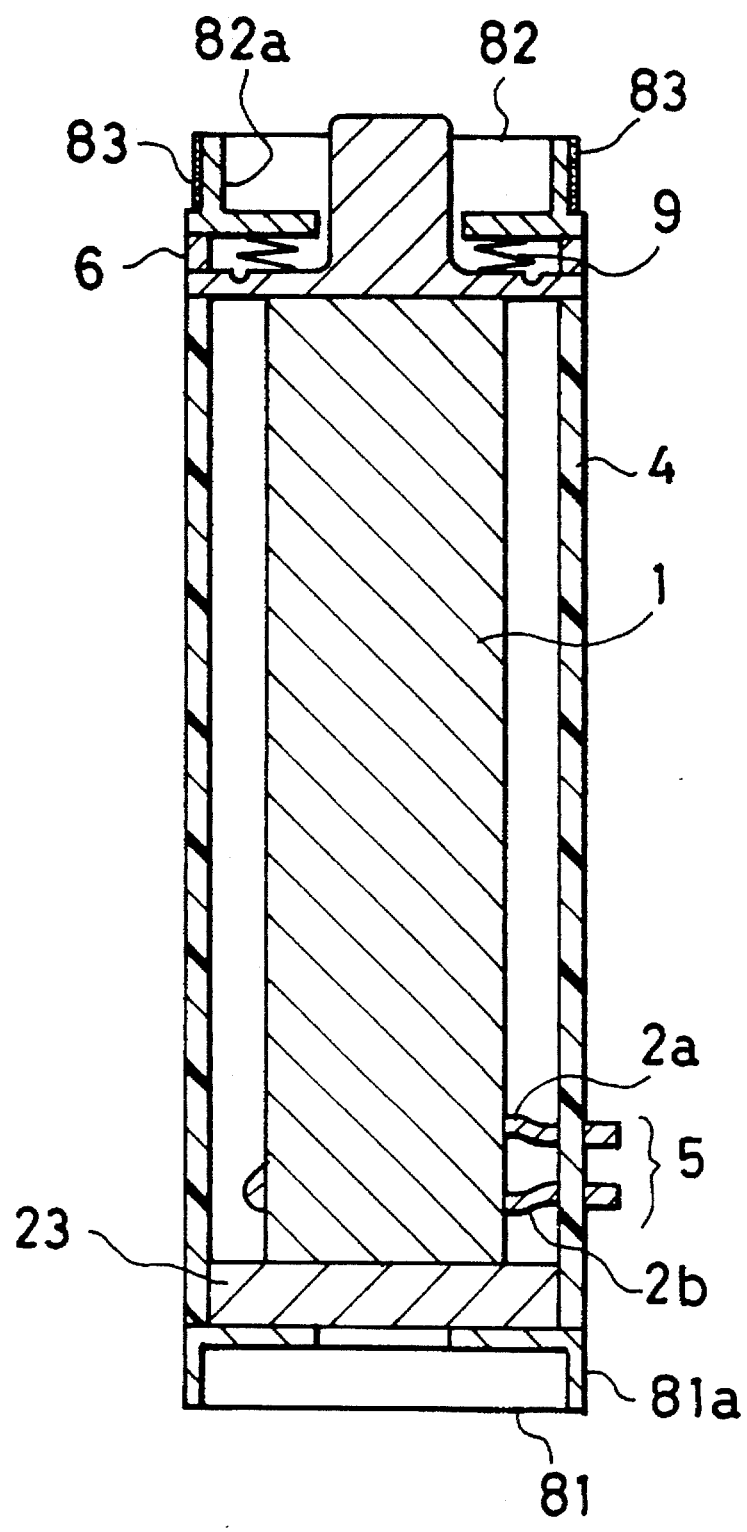
FIG. 12 is a cross-sectional view of a seventh embodiment in accordance with the invention.

FIG. 12 illustrates a seventh embodiment of a piezoelectric actuator in accordance with the invention. In the seventh embodiment, each of lower and upper couplers 81 and 82 has a cylindrical body 81a and 82a. The cylindrical body 81a of the lower coupler 81 of a piezoelectric actuator can be fit into the cylindrical body 82a of the upper coupler 82 of another piezoelectric actuator.

When the actuators in accordance with the embodiment are to be coupled to each other, an adhesive is applied to either an internal surface of the cylindrical body 81a of the lower coupler 81 or an external surface of the cylindrical body 82a of the upper coupler 82, or both of them, to thereby form an adhesive layer or adhesive layers 83 (only one layer is illustrated in FIG. 12). Then, a cylindrical body of a lower coupler of a piezoelectric actuator is press-fit into a cylindrical body of an upper coupler of another piezoelectric actuator. The sixth embodiment does not need to form threaded structures, a combination of an annular projection and a groove, a combination of projections and recesses, and small holes, and accordingly it is easier to couple actuators to one another than the aforementioned first to sixth embodiments.

The above mentioned first to seventh embodiments make it possible to couple a plurality of encased piezoelectric actuators to one another, to thereby provide the following advantages.

1. It is easy to increase or decrease an elongation by coupling a plurality of encased piezoelectric actuators to each other or separating them apart from each other.

2. In accordance with the embodiments, what is required to do is to manufacture an piezoelectric actuator accommodating therein a unit element or an electrostriction effect element having a length of 20 mm. Thus, it is no longer necessary to prepare different lengths of metal cases unlike cases to be used for a conventional actuator in which it is necessary to prepare, for instance, three different lengths of metal cases, 20 mm, 40 mm and 60 mm.

3. Since all what is required to manufacture is only an electrostriction effect element having a length of 20 mm, it is no longer necessary to secure a plurality of unit elements having a length of 20 mm to each other for obtaining an element having a length of 40 mm, 60 mm or longer. Accordingly, it is possible to omit a step for securing elements to each other for obtaining a longer element, and also possible to decrease the number of steps for attaching lead wires to a case. As a result, the number of steps for manufacturing thousand actuators can be decreased to two-fifths of the conventional one.

4. Since only a single length for an encased piezoelectric actuator is to be prepared, the number of jigs, which have conventionally been required to prepare three kinds of length, 20 mm, 40 mm and 60 mm in accordance with a desired length of a piezoelectric actuator, can be decreased to one-third relative to the conventional number of jigs.

5. Since there is only a single kind of an actuator, a stock control for a piezoelectric actuator is easier than before. In addition, the number of steps for a stock control can be decreased to one-third relative to the conventional steps.

6. It is easy to assemble the encased piezoelectric actuator to another device by utilizing the coupling means such as the threaded portions, the annular projection and the hemispherical projections formed with the upper and lower couplers.

7. Since it is possible to take out the lead wires through the lead terminals of each of the coupled piezoelectric actuator, a common driver circuit may be used for each of actuators. Alternatively, different driver circuits may be used for each of actuators to thereby make it possible to vary and/or combine an elongation and a driver frequency of each actuator.

8. The metal case itself is not elongated, and hence it is possible to avoid a deformation of the metal case during manufacturing piezoelectric actuators by providing the case with a greater thickness than that of the diaphragm to thereby enhance the stiffness of the metal case. This brings a practical advantage of enhancing efficiency of encasing a strain generating element in the metal case.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An encased piezoelectric actuator comprising:

a strain generating element for generating strain in accordance with an externally provided driver voltage;

a case for encasing a strain generating element therein;

a diaphragm secured to one end surface of said strain generating element and of said case perpendicular to a direction along which said strain is generated, said diaphragm having a projecting portion extending along said direction;

a bottom plate being slidable on an internal surface of said case and being secured to the other end surface of said strain generating element;

a metal pipe attached to a peripheral edge of said diaphragm;

a first coupler attached to said metal pipe;

a second coupler attached to said case at the side of the other end of said strain generating element;

at least one compression spring located around said projection portion of said diaphragm and between said first coupler and said diaphragm; and each of said first and second couplers formed in the shape of a cylindrical body and are connectable to each other, one of said first and second couplers being formed with at least one projection on a circumferential surface thereof and the other coupler being formed with a recess for receiving said projection therein;

said first coupler of a first piezoelectric actuator connectable to a second coupler of a second piezoelectric actuator, said elongation of said first piezoelectric actuator being transferable to said second piezoelectric actuator through said projecting portion of said first piezoelectric actuator, said elongation being addable to an elongation of said second piezoelectric actuator into a singly directed elongation.

2. The encased piezoelectric actuator in accordance with claim 1, wherein said first coupler is formed with an externally threaded portion and said second coupler is formed with an internally threaded portion.

3. The encased piezoelectric actuator in accordance with claim 1, wherein said first coupler is formed with an internally threaded portion and said second coupler is formed with an externally threaded portion.

4. The encased piezoelectric actuator in accordance with claim 1, wherein said first coupler being formed with an annular projection and said second coupler being formed with a groove.

5. The encased piezoelectric actuator in accordance with claim 1, wherein said first coupler being formed with said groove and said second coupler being formed with said annular projection.

6. The encased piezoelectric actuator in accordance with claim 1, wherein one of said first and second couplers has a plurality of said annular projections located in parallel to each other.

7. The encased piezoelectric actuator in accordance with claim 1, wherein said annular projections have a semicircular cross section.

8. The encased piezoelectric actuator in accordance with claim 1, wherein said projection is hemispherical.

9. The encased piezoelectric actuator in accordance with claim 1, wherein each of said first and second couplers being formed with at least one hole, into which a pin is to be inserted, so that said holes of said first and second couplers are in alignment with each other when one of said first and second couplers is fit into the other.

10. The encased piezoelectric actuator in accordance with claim 1, further comprising said bottom plate is formed with a groove on a circumferential surface thereof, and an O-ring is fitted into said groove so that said bottom plate contacts with said internal surface of said case through said O-ring.

11. The encased piezoelectric actuator in accordance with claim 1, further comprising a diaphragm made of thin metal film in contact with said other end surface of said strain generating element and hermetically sealed with said case.

12. The encased piezoelectric actuator in accordance with claim 1, wherein at least one of said compression springs is a belleville spring.

13. The encased piezoelectric actuator in accordance with claim 1, further comprising an actuator of the same structure as said actuator being connected with said actuator through a coupler equipped on each of said actuators.

* * * * *